(12) United States Patent
Park et al.

(10) Patent No.: US 10,685,929 B2
(45) Date of Patent: Jun. 16, 2020

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Chang Hwa Park, Suwon-Si (KR); Ga Young Yoo, Suwon-Si (KR); Sang Ah Kim, Suwon-Si (KR); Yu Rim Choi, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/958,699

(22) Filed: Apr. 20, 2018

(65) Prior Publication Data

US 2019/0067227 A1 Feb. 28, 2019

(30) Foreign Application Priority Data

Aug. 28, 2017 (KR) .................. 10-2017-0108774

(51) Int. Cl.
*H01L 23/48* (2006.01)
*H01L 21/283* (2006.01)
(Continued)

(52) U.S. Cl.
CPC ............. *H01L 24/09* (2013.01); *H01L 24/14* (2013.01); *H01L 24/17* (2013.01); *H01L 24/20* (2013.01);
(Continued)

(58) Field of Classification Search
CPC . H01L 23/16; H01L 23/3135; H01L 23/5226; H01L 21/768; H01L 23/3114;
(Continued)

(56) References Cited

U.S. PATENT DOCUMENTS

| 8,994,086 B2 | 3/2015 | Yamazaki et al. |
| 2003/0088978 A1 | 5/2003 | Takano et al. |

(Continued)

FOREIGN PATENT DOCUMENTS

| CN | 104051379 A | 9/2014 |
| JP | 2012-114217 A | 6/2012 |

(Continued)

OTHER PUBLICATIONS

Korean Office Action dated Jan. 6, 2019 issued in Korean Patent Application No. 10-2017-0108774 (with English translation).
(Continued)

*Primary Examiner* — Brian Turner
(74) *Attorney, Agent, or Firm* — Morgan, Lewis & Bockius LLP

(57) ABSTRACT

A semiconductor package includes: a semiconductor chip having an active surface having connection pads disposed thereon and an inactive surface opposing the active surface; an encapsulant encapsulating at least portions of the semiconductor chip; and a connection member including a first insulating layer disposed on the active surface of the semiconductor chip, a first redistribution layer disposed on the first insulating layer, first vias penetrating through the first insulating layer and electrically connecting the connection pads and the first redistribution layer to each other, and a first insulating film covering the first insulating layer and the first redistribution layer. The first insulating film includes a silicon based compound.

24 Claims, 11 Drawing Sheets

(51) Int. Cl.
*H01L 23/00* (2006.01)
*H01L 25/065* (2006.01)
*H01L 23/31* (2006.01)
*H01L 23/552* (2006.01)
*H01L 23/66* (2006.01)

(52) U.S. Cl.
CPC ...... *H01L 25/0657* (2013.01); *H01L 23/3128* (2013.01); *H01L 23/552* (2013.01); *H01L 23/66* (2013.01); *H01L 24/13* (2013.01); *H01L 2224/02379* (2013.01); *H01L 2224/0401* (2013.01); *H01L 2224/13101* (2013.01); *H01L 2224/16225* (2013.01); *H01L 2224/18* (2013.01); *H01L 2224/73204* (2013.01); *H01L 2225/06513* (2013.01); *H01L 2225/06586* (2013.01); *H01L 2924/10252* (2013.01); *H01L 2924/10253* (2013.01); *H01L 2924/10329* (2013.01); *H01L 2924/1431* (2013.01); *H01L 2924/1433* (2013.01); *H01L 2924/1436* (2013.01); *H01L 2924/15311* (2013.01); *H01L 2924/15313* (2013.01); *H01L 2924/18162* (2013.01); *H01L 2924/3511* (2013.01)

(58) Field of Classification Search
CPC ......... H01L 23/49838; H01L 23/49894; H01L 24/19; H01L 24/20; H01L 24/96; H01L 24/97; H01L 25/105; H01L 21/56; H01L 25/0657
See application file for complete search history.

(56) References Cited

U.S. PATENT DOCUMENTS

| | | | | |
|---|---|---|---|---|
| 2008/0197513 | A1* | 8/2008 | Restaino | H01L 21/76822 257/784 |
| 2010/0038793 | A1* | 2/2010 | Bonilla | H01L 21/76826 257/762 |
| 2012/0124829 | A1 | 5/2012 | Kamei et al. | |
| 2012/0129335 | A1* | 5/2012 | Ikumo | H01L 23/3192 438/614 |
| 2012/0273962 | A1* | 11/2012 | Li | H01L 23/5222 257/774 |
| 2012/0319254 | A1 | 12/2012 | Kikuchi et al. | |
| 2013/0223789 | A1* | 8/2013 | Lee | G02B 6/4214 385/14 |
| 2013/0320522 | A1* | 12/2013 | Lai | H01L 24/05 257/737 |
| 2014/0070396 | A1 | 3/2014 | Kyozuka et al. | |
| 2014/0264830 | A1* | 9/2014 | Teh | H01L 23/53238 257/737 |
| 2014/0291859 | A1* | 10/2014 | Kiwanami | H01L 23/485 257/774 |
| 2016/0043047 | A1 | 2/2016 | Shim et al. | |
| 2016/0208387 | A1 | 7/2016 | Liu et al. | |
| 2016/0322332 | A1* | 11/2016 | Kim | H01L 23/16 |
| 2016/0359100 | A1* | 12/2016 | Bhushan | H01L 43/02 |
| 2017/0133288 | A1* | 5/2017 | Baek | H01L 24/81 |
| 2017/0141055 | A1 | 5/2017 | Liu et al. | |

FOREIGN PATENT DOCUMENTS

| | | |
|---|---|---|
| JP | 2014/056925 A | 3/2014 |
| JP | 2014-192452 A | 10/2014 |
| KR | 10-2003-0040083 A | 5/2003 |
| KR | 10-2003-0064737 A | 8/2003 |
| KR | 10-2007-0028619 A | 3/2007 |
| KR | 10-2010-0097495 A | 9/2010 |
| TW | 201618196 A | 5/2016 |
| TW | 201624631 A | 7/2016 |
| TW | 201724422 A | 7/2017 |
| WO | 02/079542 A2 | 10/2002 |
| WO | 2006/008882 A1 | 1/2006 |
| WO | 2011/108308 A1 | 9/2011 |

OTHER PUBLICATIONS

Taiwanese Office Action dated Oct. 24, 2018 issued in Taiwanese Patent Application No. 107114615 (with English translation).
Office Action issued in corresponding Taiwanese Application No. 107114615, dated May 10, 2019.

* cited by examiner

FAN-OUT SEMICONDUCTOR PACKAGE

CROSS-REFERENCE TO RELATED APPLICATION(S)

This application claims benefit of priority to Korean Patent Application No. 10-2017-0108774 filed on Aug. 28, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

Semiconductor packages have been continuously required to be thinned and lightened in terms of a shape, and have been required to be implemented in a system in package (SiP) form requiring complexation and multi-functionality in terms of a function. In accordance with such a development trend, a fan-out wafer level package (FOWLP) has been recently prominent, and attempts to satisfy requirements of semiconductor packaging by applying several techniques to the FOWLP have been conducted. Particularly, in accordance with the approach of commercialization of 5G mobile communications and Internet of things (IoT), it is required to process data that are explosively increased and perform communications between semiconductors or between devices in a radio frequency region. To this end, in all boards such as a semiconductor, a semiconductor package, a mainboard, and the like, it has been demanded to implement circuits having a finer pitch, more excellent signal transfer characteristics, and higher reliability as compared to existing cases.

Meanwhile, as existing circuit line widths and circuit pitches gradually become finer, surfaces of an insulating material and a metal circuit need to be smooth without substantially having a surface roughness. However, in this case, physical coupling force due to the surface roughness hardly exists, such that close adhesion between respective layers or between an insulating material and a metal circuit is decreased to cause a defect such as delamination. In addition, a photoimagable dielectric (PID) mainly used in a fan-out wafer level package (FOWLP) requires heat treatment at a high temperature in a process to promote oxidation of a copper circuit mainly used as the metal circuit, resulting in a reduction in close adhesion between the PID and the copper circuit.

SUMMARY

An aspect of the present disclosure may provide a fan-out semiconductor package in which close adhesion between an insulating material and a metal circuit may be improved, heat resistance characteristics may be high, and diffusion of a metal may be suppressed, in a connection member for redistributing connection pads of a semiconductor chip.

According to an aspect of the present disclosure, a fan-out semiconductor package may be provided, in which a thin insulating film is formed on an interface between an insulating material and a metal circuit using a silicon based compound in a connection member for redistributing connection pads of a semiconductor chip.

According to an aspect of the present disclosure, a semiconductor package may include: a semiconductor chip having an active surface having connection pads disposed thereon and an inactive surface opposing the active surface; an encapsulant encapsulating at least portions of the semiconductor chip; and a connection member including a first insulating layer disposed on the active surface of the semiconductor chip, a first redistribution layer disposed on the first insulating layer, first vias penetrating through the first insulating layer and electrically connecting the connection pads and the first redistribution layer to each other, and a first insulating film covering the first insulating layer and the first redistribution layer. The first insulating film may include a silicon based compound.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
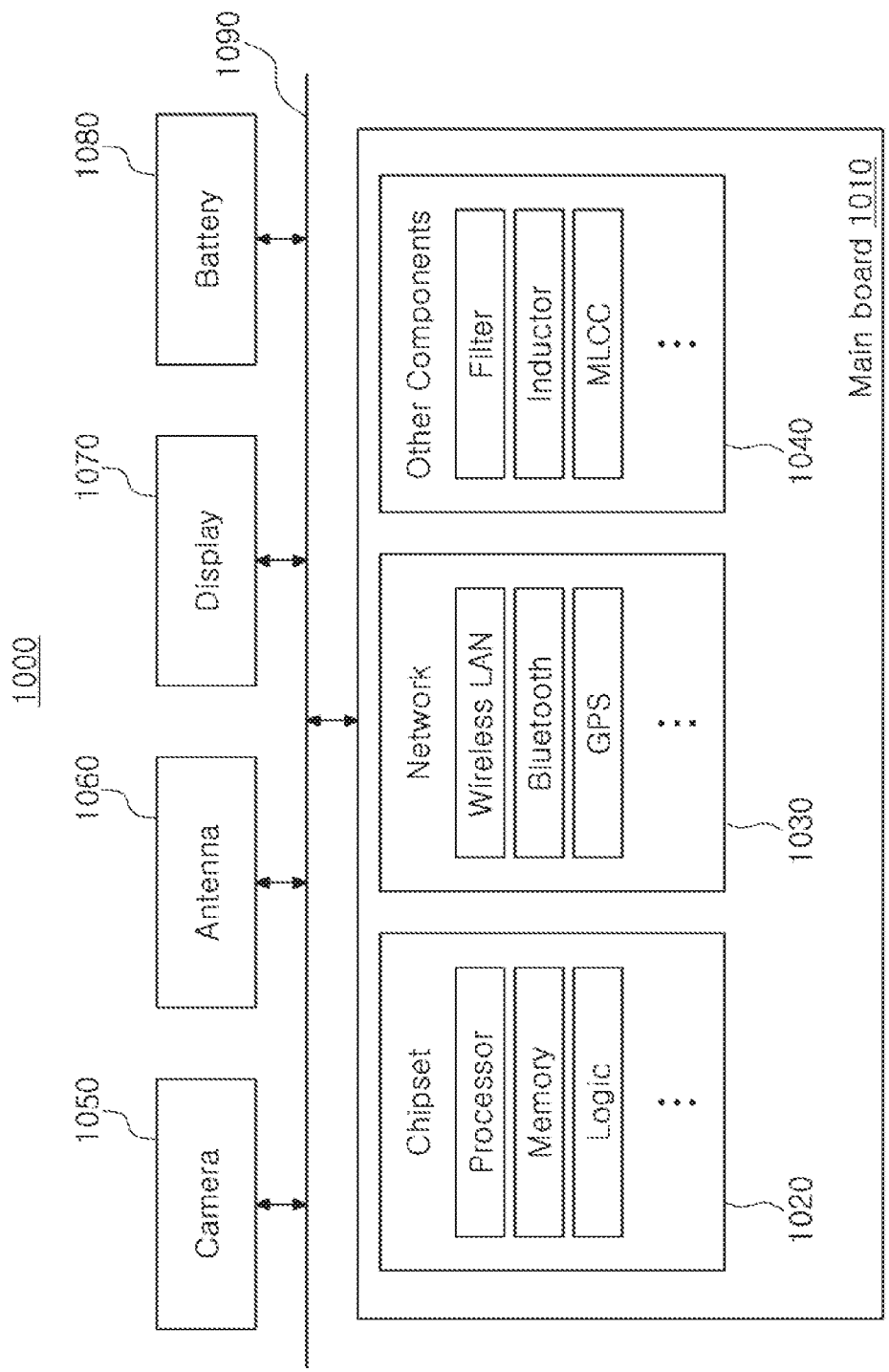
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
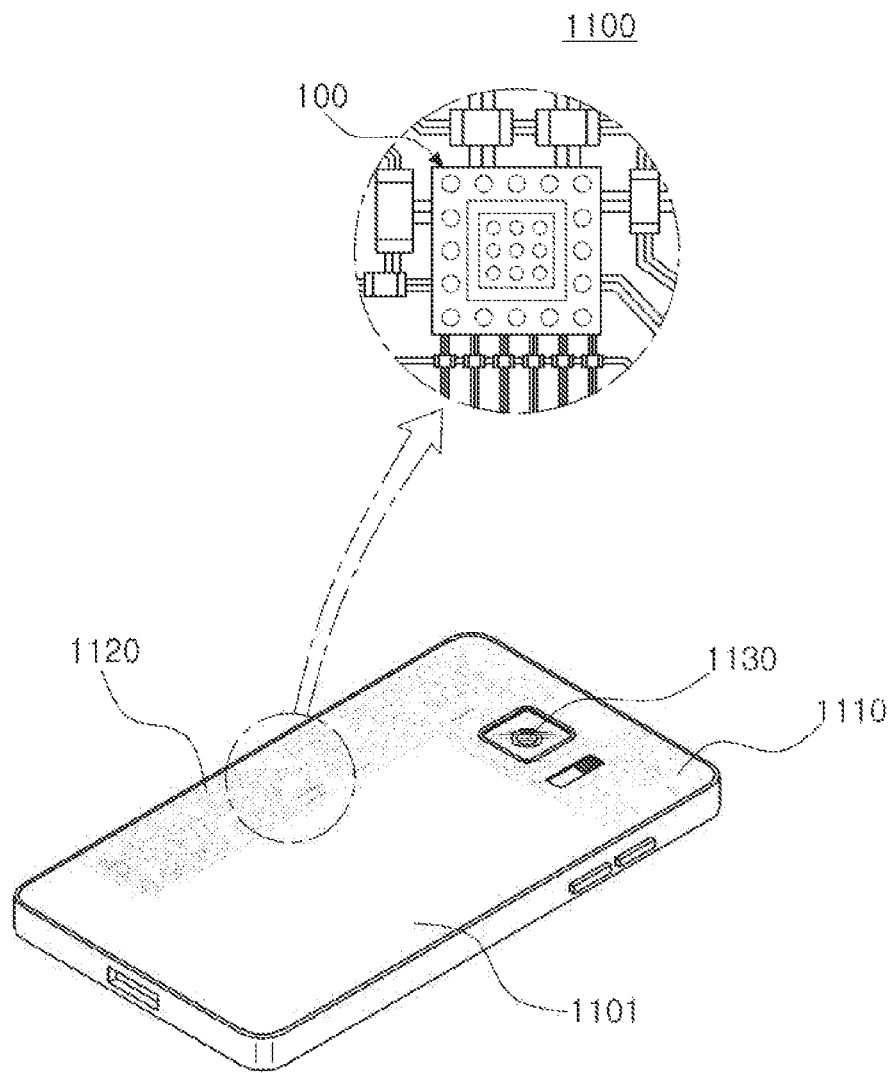
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
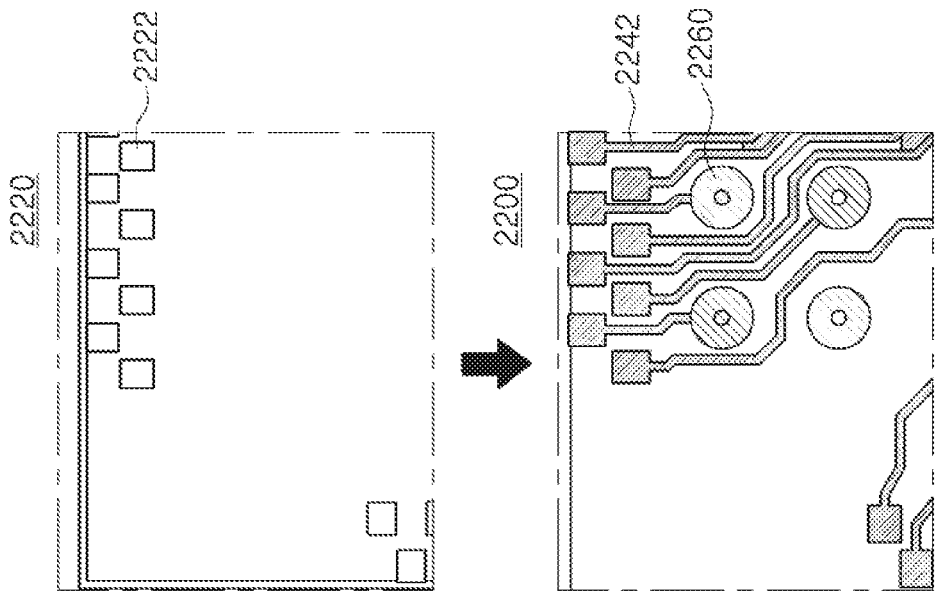
FIGS. 3A and 3B are schematic cross-sectional views illustrating states of a fan-in semiconductor package before and after being packaged.
Figure 3A:
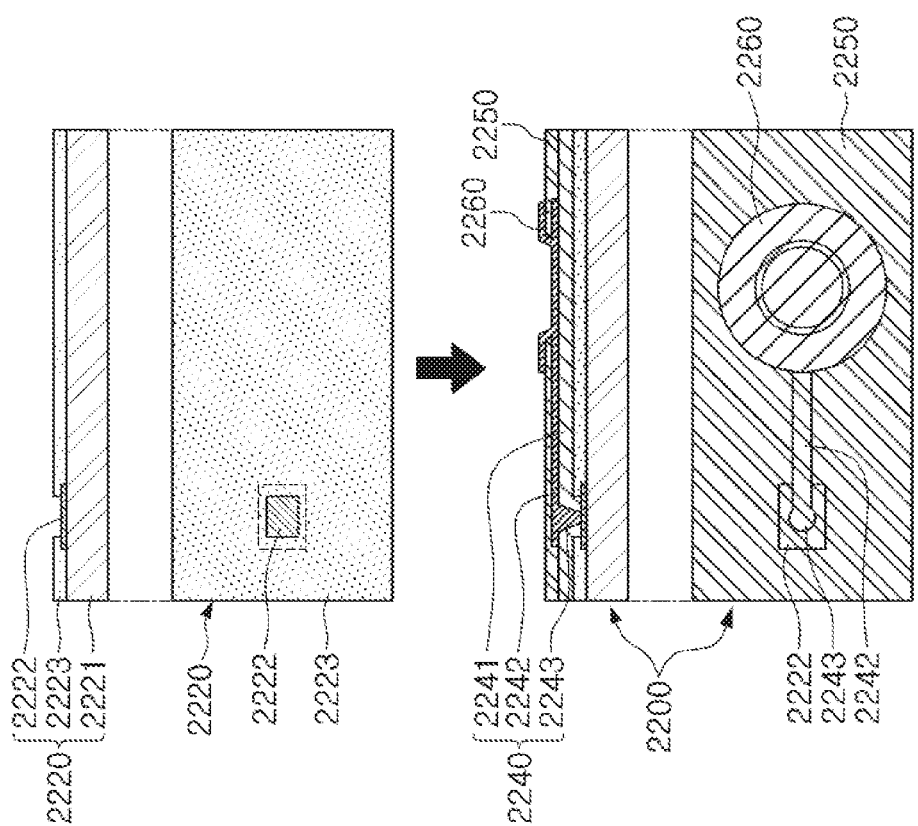

FIGS. 3A and 3B are schematic cross-sectional views illustrating states of a fan-in semiconductor package before and after being packaged.

Figure 4:
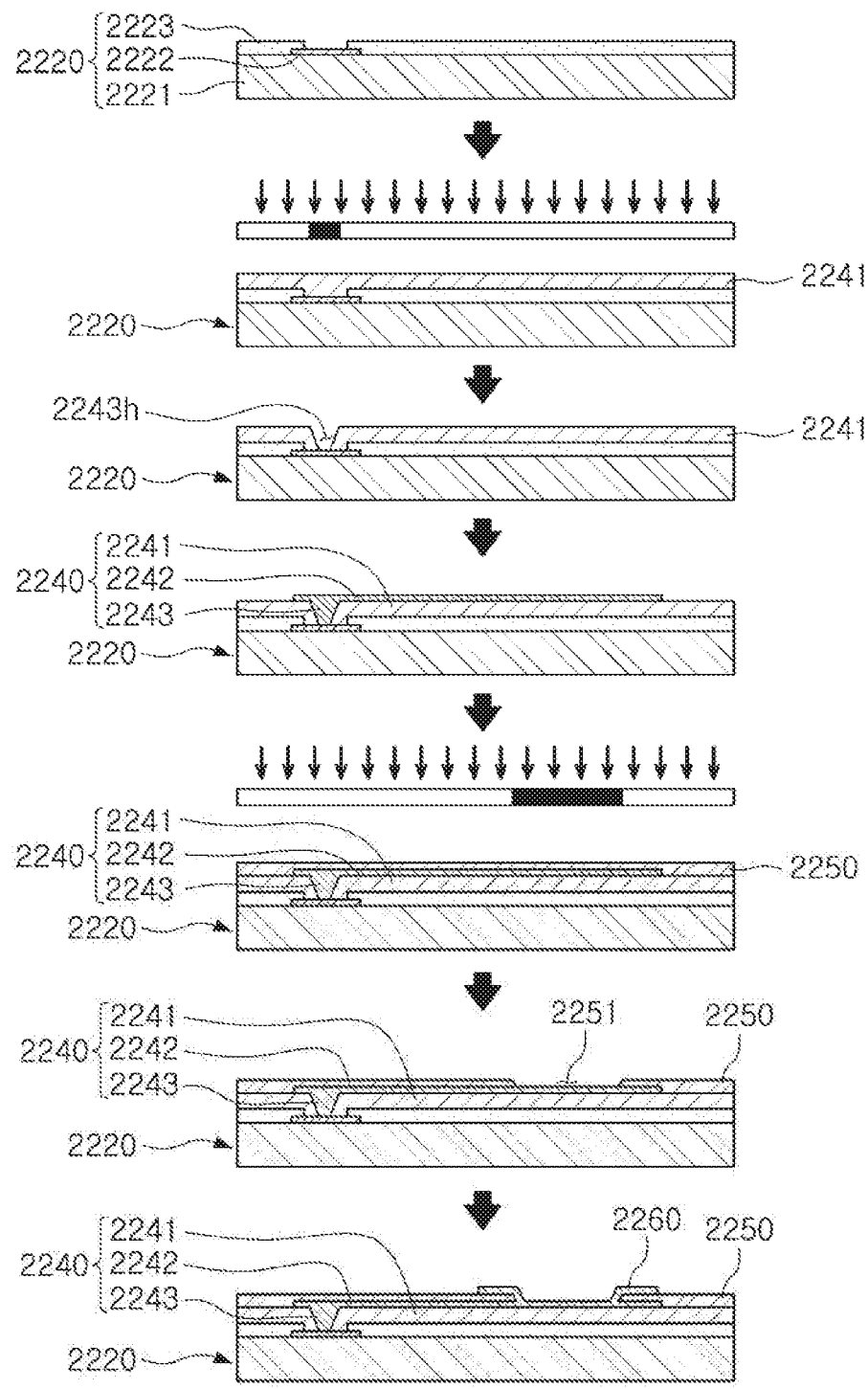
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
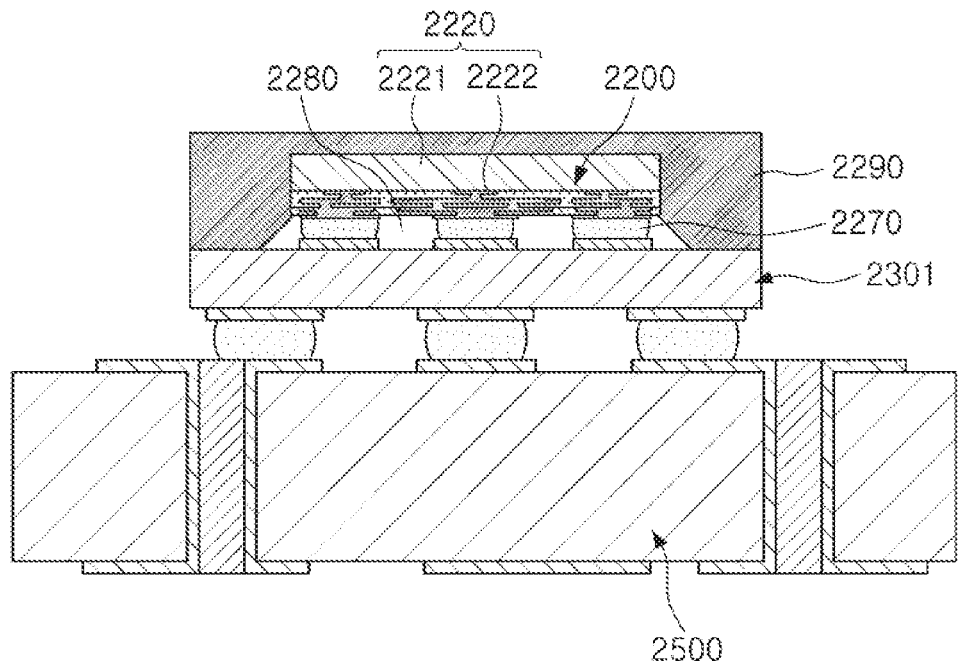
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
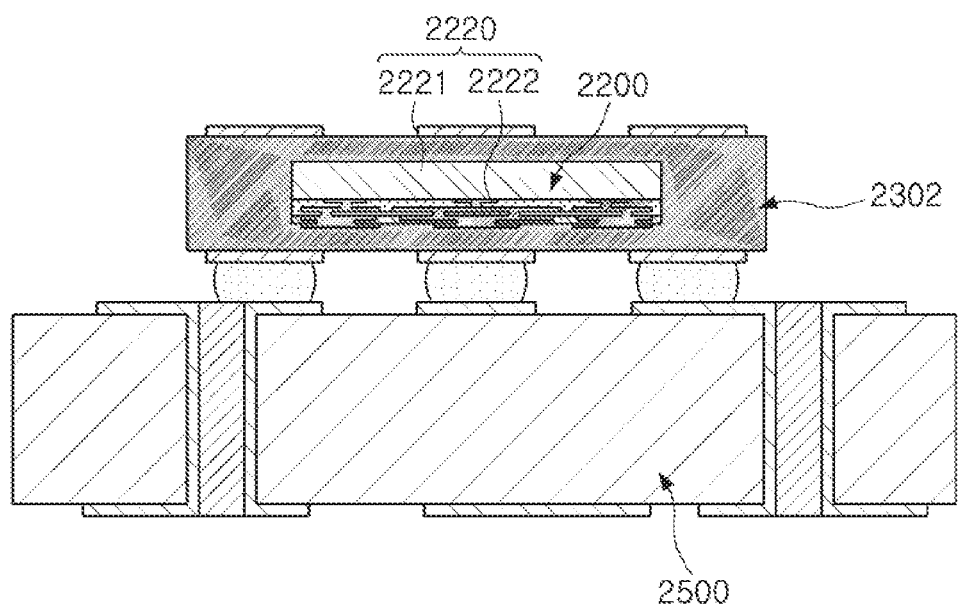
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
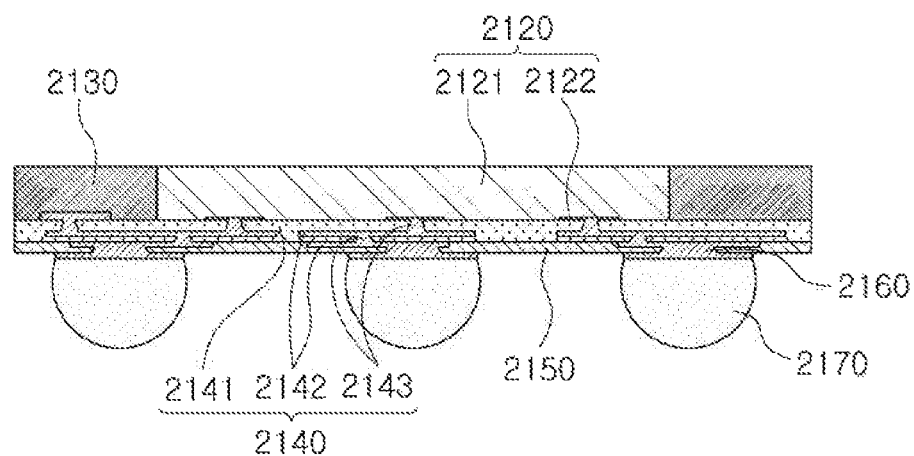
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
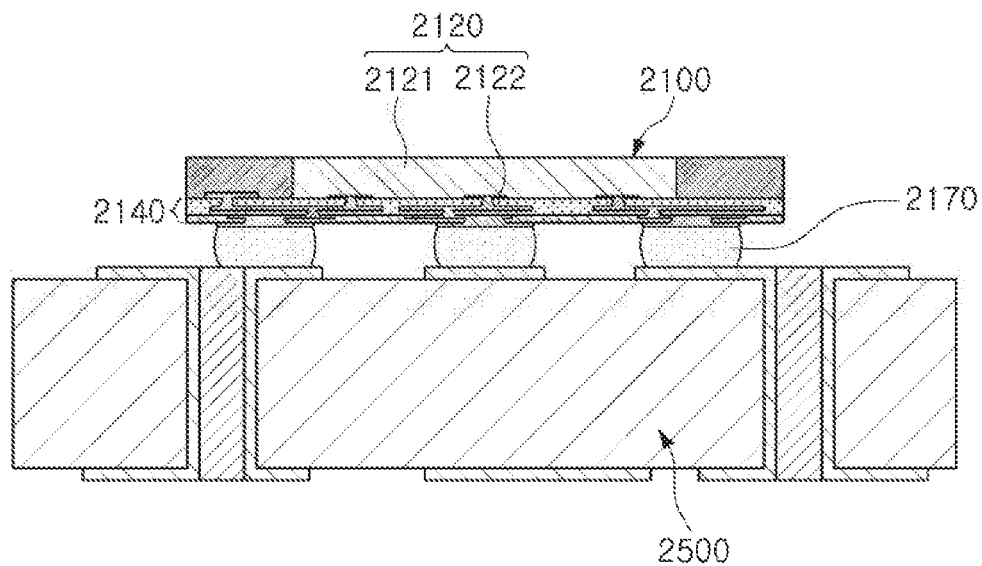
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which close adhesion between an insulating material and a metal circuit may be improved, heat resistance characteristics may be high, and diffusion of a metal may be suppressed, in a connection member for redistributing connection pads of a semiconductor chip will hereinafter be described with reference to the drawings.

Figure 9:
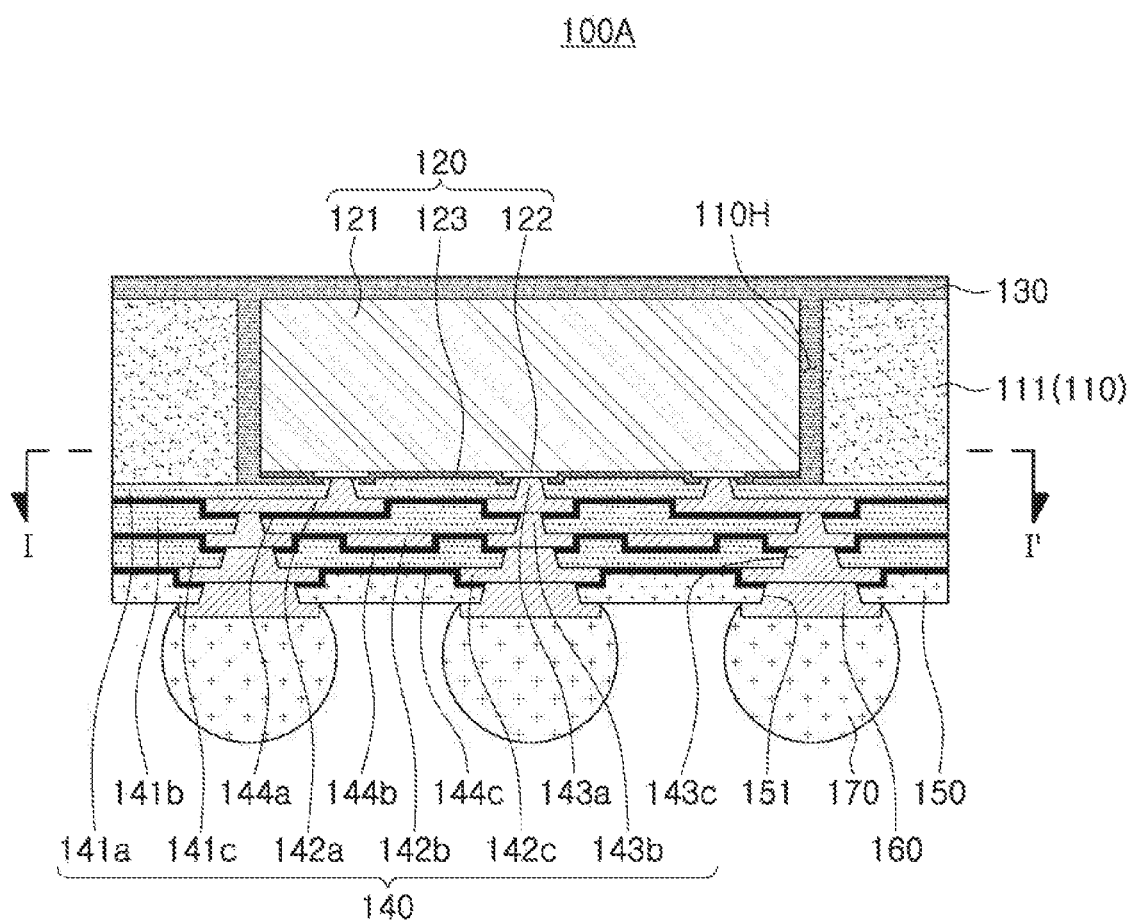
FIG. 9 is a schematic cross-sectional view illustrating an example of a fan-out semiconductor package.

FIG. 9 is a schematic cross-sectional view illustrating an example of a fan-out semiconductor package.

Figure 10:
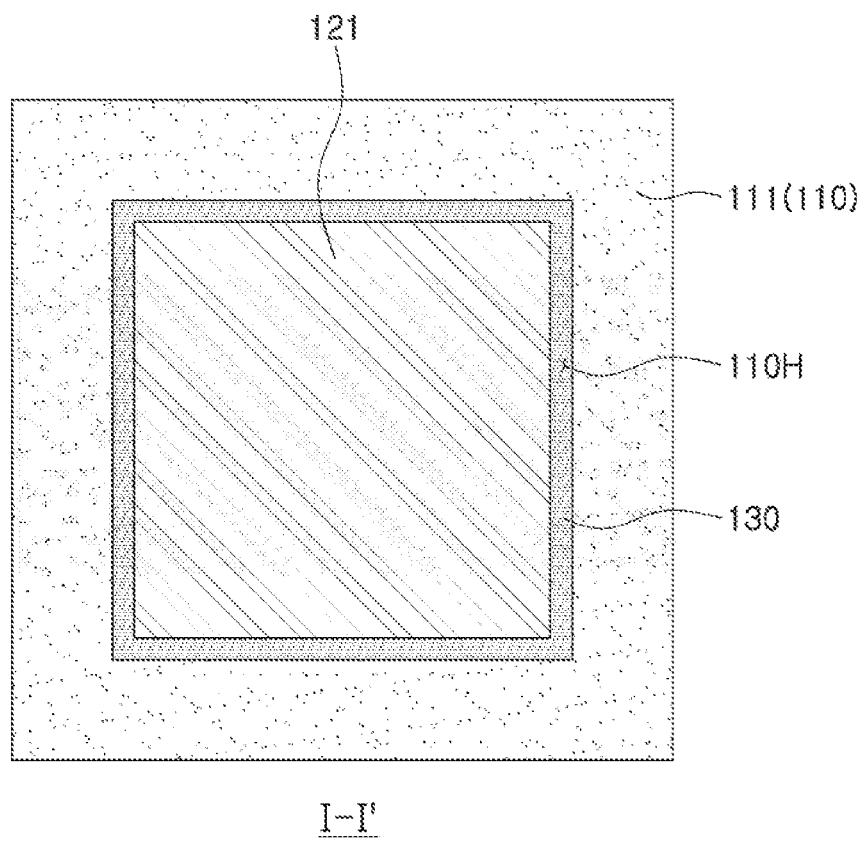
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to FIGS. 9 and 10, a fan-out semiconductor package 100A according to an exemplary embodiment in the present disclosure may include a core member 110 having a through-hole 110H, a semiconductor chip 120 disposed in the through-hole 110H of the core member 110 and having an active surface having connection pads 122 disposed thereon and an inactive surface opposing the active surface, an encapsulant 130 encapsulating at least portions of the core member 110 and the semiconductor chip 120, a connection member 140 disposed on the core member 110 and the active surface of the semiconductor chip 120, a passivation layer 150 disposed on the connection member 140, underbump metal layers 160 disposed in openings 151 of the passivation layer 150, and electrical connection structures 170 disposed on the passivation layer 150 and connected to the underbump metal layers 160.

The connection member 140 may include a first insulating layer 141a disposed on the core member 110 and the active surface of the semiconductor chip 120, a first redistribution layer 142a disposed on the first insulating layer 141a, first vias 143a electrically connecting the first insulating layer 141a and the connection pads 122 of the semiconductor chip 120 to each other, a first insulating film 144a covering the first insulating layer 141a and the first redistribution layer 142a, a second insulating layer 141b disposed on the insulating film 144a, a second redistribution layer 142b disposed on the second insulating layer 141b, second vias 143b penetrating through the second insulating layer 141b and electrically connecting the first and second redistribution layers 142a and 142b to each other, a second insulating film 144b covering the second insulating layer 141b and the second redistribution layer 142b, a third insulating layer 141c disposed on the second insulating film 144b, a third redistribution layer 142c disposed on the third insulating layer 141c, third vias 143c penetrating through the third insulating layer 141c and electrically connecting the second and third redistribution layers 142b and 142c to each other, and a third insulating film 144c covering the third insulating layer 141c and the third redistribution layer 142c.

The first insulating film 144a of the connection member 140 may exist on an interface between the first insulating layer 141a and the second insulating layer 141b and an interface between the first redistribution layer 142a and the second insulating layer 141b, the second insulating film 144b of the connection member 140 may exist on an interface between the second insulating layer 141b and the third insulating layer 141c and an interface between the second redistribution layer 142b and the third insulating layer 141c, and the third insulating film 144c of the connection member 140 may exist on an interface between the third insulating layer 141c and the passivation layer 150 and an interface between the third redistribution layer 142c and the passivation layer 150. Each of the first to third insulating films 144a, 144b, and 144c may include a silicon based compound. The connection member 140 may include larger numbers of insulating layers, redistribution layers, vias, and insulating films or include smaller numbers of insulating layers, redistribution layers, vias, and insulating films.

Meanwhile, as described above, in the semiconductor package, as existing circuit line widths and circuit pitches gradually become finer, surfaces of an insulating material and a metal circuit need to be smooth without substantially having a surface roughness. However, in this case, physical coupling force due to the surface roughness hardly exists, such that close adhesion between respective layers or between an insulating material and a metal circuit is decreased to cause a defect such as delamination. In addition, a photoimagable dielectric (PID) mainly used as an insulating material requires heat treatment at a high temperature in a process to promote oxidation of a copper circuit mainly used as the metal circuit, resulting in a reduction in close adhesion between the PID and the copper circuit.

As a method of improving the close adhesion between the insulating material and the metal circuit in a state in which a surface roughness hardly exist, a method of coupling a portion in which a silicon (Si) group exists to the copper circuit and coupling a portion in which a functional group such as an amine group exists to epoxy of an insulating layer using an organic coating of a silane based coupling agent to increase bonding force between two layers may be considered. However, the organic coating of the silane based coupling agent is vulnerable to heat, and various related problems may thus occur in a process. Alternatively, a method of additionally forming a heterogeneous metal film, a metal oxide film, or the like, having high close adhesion on the copper circuit to increase the close adhesion may be considered. However, in this case, an intermetallic compound (IMC) may be formed, resulting in a characteristic deterioration problem such as signal loss deterioration, or the like.

On the other hand, in the fan-out semiconductor package 100A according to the exemplary embodiment, as described above, a thin insulating film including the silicon based compound, more specifically, silicon oxide, silicon nitride, and/or silicon oxynitride may be formed between the insulating layer, which is the insulating material, and the redistribution layer, which is the metal circuit. In this case, the close adhesion between the insulating material and the metal circuit may be secured even in a state in which a surface roughness hardly exists. Particularly, such an insulating film may secure high thermal stability, and may suppress diffusion of copper and growth of an oxide film in a process of stacking an insulating material and a high temperature reliability evaluation to secure reliability. In addition, such an insulating film does not form the IMC, such that the characteristic deterioration problem such as the signal loss deterioration, or the like, is small. That is, since surfaces of the copper circuit and the insulating material are not etched, high close adhesion may be secured on the surfaces that do not have a surface roughness, which may facilitate a transfer of a radio frequency signal. In addition, the insulating layers may be separated from each other by the insulating film to prevent movement of pollutants or impurities.

The respective components included in the fan-out semiconductor package 100A according to the exemplary embodiment will hereinafter be described in more detail.

The core member 110 may improve rigidity of the fan-out semiconductor package 100A depending on certain materials, and serve to secure uniformity of a thickness of the encapsulant 130. When wiring layers, vias, and the like, are formed in the core member 110, the fan-out semiconductor package 100A may be utilized as a package-on-package (POP) type package. The core member 110 may have the through-hole 110H. The semiconductor chip 120 may be disposed in the through-hole 110H to be spaced apart from the core member 110 by a predetermined distance. Side surfaces of the semiconductor chip 120 may be surrounded by the core member 110. However, such a form is only an example and may be variously modified to have other forms, and the core member 110 may perform another function depending on such a form. The core member 110 may be omitted, if necessary, but it may be more advantageous in securing board level reliability intended in the present disclosure that the fan-out semiconductor package 100A includes the core member 110.

The core member 110 may include a dielectric layer 111. An insulating material may be used as a material of the dielectric layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. When a material having high rigidity, such as prepreg including a glass fiber, or the like, is used as the material of the dielectric layer, the core member 110 may be utilized as a support member for controlling warpage of the fan-out semiconductor package 100A.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may further be formed on the active surface of the semiconductor chip 120, if necessary, and bumps (not illustrated), or the like, may be connected to the connection pads 122.

The encapsulant 130 may protect the core member 110, the semiconductor chip 120, and the like. An encapsulation form of the encapsulant 130 is not particularly limited, but may be a form in which the encapsulant 130 surrounds at least portions of the core member 110, the semiconductor chip 120, and the like. For example, the encapsulant 130 may cover the core member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions.

The connection member 140 may include the first insulating layer 141a disposed on the core member 110 and the active surface of the semiconductor chip 120, the first redistribution layer 142a disposed on the first insulating layer 141a, the first vias 143a electrically connecting the first insulating layer 141a and the connection pads 122 of the semiconductor chip 120 to each other, the first insulating film 144a covering the first insulating layer 141a and the first redistribution layer 142a, the second insulating layer 141b disposed on the insulating film 144a, the second redistribution layer 142b disposed on the second insulating layer 141b, the second vias 143b penetrating through the second insulating layer 141b and electrically connecting the first and second redistribution layers 142a and 142b to each other, the second insulating film 144b covering the second insulating layer 141b and the second redistribution layer 142b, the third insulating layer 141c disposed on the second insulating film 144b, the third redistribution layer 142c disposed on the third insulating layer 141c, the third vias 143c penetrating through the third insulating layer 141c and electrically connecting the second and third redistribution layers 142b and 142c to each other, and the third insulating film 144c covering the third insulating layer 141c and the third redistribution layer 142c.

The first insulating film 144a of the connection member 140 may exist on the interface between the first insulating layer 141a and the second insulating layer 141b and the interface between the first redistribution layer 142a and the second insulating layer 141b, the second insulating film 144b of the connection member 140 may exist on the interface between the second insulating layer 141b and the third insulating layer 141c and the interface between the second redistribution layer 142b and the third insulating layer 141c, and the third insulating film 144c of the connection member 140 may exist on the interface between the third insulating layer 141c and the passivation layer 150 and the interface between the third redistribution layer 142c and the passivation layer 150. Each of the first to third insulating films 144a, 144b, and 144c may include the silicon based compound. The connection member 140 may include larger numbers of insulating layers, redistribution layers, vias, and insulating films or include smaller numbers of insulating layers, redistribution layers, vias, and insulating films.

In the fan-out semiconductor package 100A according to the exemplary embodiment, as described above, the thin insulating film including the silicon based compound may be formed between the insulating layer, which is the insulating material, and the redistribution layer, which is the metal circuit. In this case, the close adhesion between the insulating material and the metal circuit may be secured even in a state in which a surface roughness hardly exists. Particularly, such an insulating film may secure high thermal stability as compared to a silane based organic coating, and may suppress diffusion of copper and growth of an oxide film in a process of stacking an insulating material and a high temperature reliability evaluation to secure reliability. In addition, such an insulating film does not form the IMC, such that the characteristic deterioration problem such as the signal loss deterioration, or the like, is small. That is, since surfaces of the copper circuit and the insulating material are not etched, high close adhesion may be secured on the surfaces that do not have a surface roughness, which may facilitate a transfer of a radio frequency signal. In addition, the insulating layers may be separated from each other by the insulating film to prevent movement of pollutants or impurities.

A material of each of the insulating layers 141a, 141b, and 141c may be an insulating material. In this case, in addition to the insulating material as described above, a photosensitive insulating material such as a photoimagable dielectric (PID) resin may also be used as the insulating material. That is, the insulating layers 141a, 141b, and 141c may be photosensitive insulating layers. When the insulating layers 141a, 141b, and 141c have photosensitive properties, the insulating layers 141a, 141b, and 141c may be formed to have a smaller thickness, and fine pitches of the vias 143a, 143b, and 143c may be achieved more easily. The insulating layers 141a, 141b, and 141c may be photosensitive insulating layers including an insulating resin and an inorganic filler. When the insulating layers 141a, 141b, and 141c are multiple layers, the materials of the insulating layers 141a, 141b, and 141c may be the same as each other, and may also be different from each other, if necessary. The number of insulating layers may be more than that illustrated in the drawing. An insulating thickness between patterns except for the respective insulating layers 141a, 141b, and 141c, redistribution layers 142a, 142b, and 142c, and insulating films 144a, 144b, and 144c may be approximately 1 μm to 10 μm.

The redistribution layers 142a, 142b, and 142c may serve to substantially redistribute the connection pads 122. A material of each of the redistribution layers 142a, 142b, and 142c may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of corresponding layers. For example, the redistribution layers 142a, 142b, and 142c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142a, 142b, and 142c may include via pad patterns, electrical connection structure pad patterns, and the like. Each of the redistribution layers 142a, 142b, and 142c may have a thickness of about 0.5 μm to 15 μm.

The vias 143a, 143b, and 143c may electrically connect the redistribution layers 142a, 142b, and 142c, the connection pads 122, and the like, formed on different layers to each other, resulting in an electrical path in the fan-out semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with the conductive material, or the conductive material may also be formed along a wall of each of the vias. In addition, each of the vias 143a, 143b, and 143c may have any shape known in the related art, such as a tapered shape, a cylindrical shape, and the like.

The insulating films 144a, 144b, and 144c may improve close adhesion between the insulating layers 141a, 141b, and 141c, the passivation layer 150, and the redistribution layers 142a, 142b, and 142c, and prevent movement of pollutants and impurities between the layers. Each of the insulating films 144a, 144b, and 144c may include the silicon based compound such as a silicon based inorganic compound. In detail, each of the insulating films 144a, 144b, and 144c may include at least one of silicon oxide such as $SiO_2$, silicon nitride such as $SiN_x$, and silicon oxynitride such as $SiO_xN_y$, $SiO_xN_yH_z$, or the like. Each of the insulating films 144a, 144b, and 144 may consist of one or more insulating inorganic compounds such as one or more silicon based inorganic compounds including at least one of silicon oxide such as $SiO_2$, silicon nitride such as $SiN_x$, and silicon oxynitride such as $SiO_xN_y$, $SiO_xN_yH_z$, or the like. Each of the insulating films 144a, 144b, and 144c may have a thickness of about 0.01 μm to 0.5 μm, more preferably, about 0.01 μm to 0.2 μm. In this thickness range, the insulating films 144a, 144b, and 144c may secure sufficient close adhesion and significantly reduce a side effect. Each of the insulating films 144a, 144b, and 144c may include a plurality of layers, a thickness of each of the plurality of layers may be about 5 nm to 100 nm, and a final thickness of each of the insulating films 144a, 144b, and 144c may be about 0.01 μm to 0.5 μm, more preferably, about 0.01 μm to 0.2 μm, as described above.

The passivation layer 150 may protect the connection member 140 from external physical or chemical damage. The passivation layer 150 may have the openings 151 exposing at least portions of the redistribution layer 142c of the connection member 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layers 160 may improve connection reliability of the electrical connection structures 170 to improve board level reliability of the fan-out semiconductor package 100A. The underbump metal layers 160 may be connected to the redistribution layer 142c of the connection member 150 exposed through the openings 151 of the passivation layer 150. The underbump metal layers 160 may be formed in the openings 151 of the passivation layer 150 by any known metallization method using any known conductive metal such as a metal, but is not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the passivation layer 150, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, a passive component, for example, a surface mounting technology (SMT) component including an inductor, a capacitor, or the like, may be disposed on a surface of the passivation layer 150, if necessary.

Figure 11:
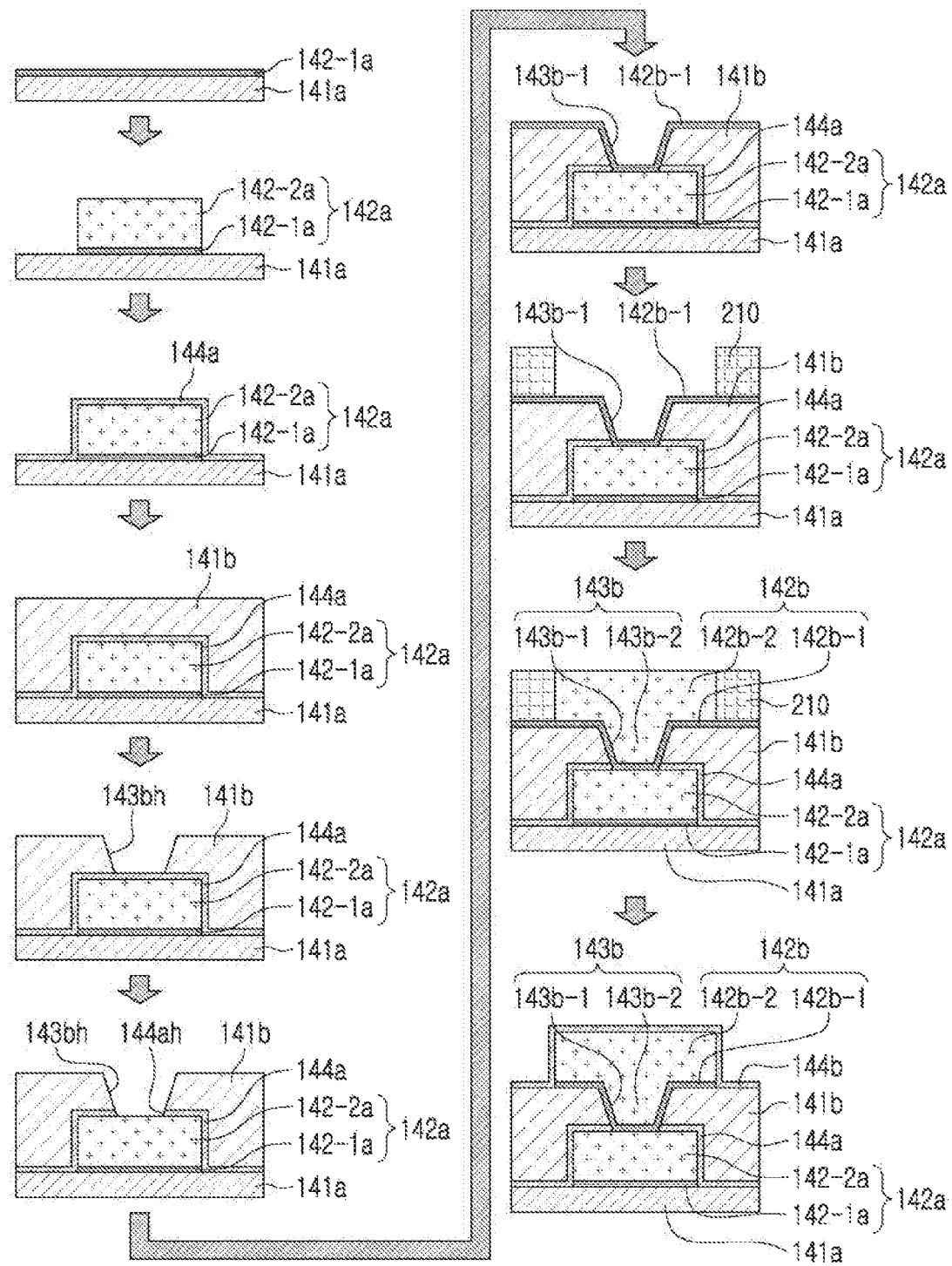
FIG. 11 is schematic views illustrating processes of manufacturing a connection member of the fan-out semiconductor package of FIG. 9.

FIG. 11 is schematic views illustrating processes of manufacturing a connection member of the fan-out semiconductor package of FIG. 9.

Referring to FIG. 11, a first seed layer 142-1a may be first formed on the first insulating layer 141a. The first seed layer 142-1a may be formed by a plating process using sputtering, or the like. The first seed layer 142-1a may be one layer or a plurality of layers including Ti, Cu, $TiO_2$, Ta, $TaO_2$, or the like, but is not limited thereto. Then, a first plating layer 142-2a may be formed on the first seed layer 142-1a by any known plating method using a dry film, or the like, and portions of the first seed layer 142-1a except for patterns may be removed by an etching method. Resultantly, the first redistribution layer 142a may be formed. Then, the first insulating film 144a covering the first insulating layer 141a and the first redistribution layer 142a may be formed on the first insulating layer 141a and the first redistribution layer 142a using the abovementioned silicon based compound such as the silicon based inorganic compound. The first insulating film 144a may be formed by a plasma deposition method. The plasma deposition method may be plasma enhanced chemical vapor deposition (PECVD), inductively coupled plasma (ICP), sputtering, evaporation, or the like. Then, the second insulating layer 141b may be formed on the first insulating film 144a by any known lamination method. Then, a second via hole 143bh may be formed in the second insulating layer 141b by a photolithography method, or the like. Then, the first insulating film 144a exposed by the second via hole 143bh may be removed by a dry etching method or a wet etching method to form an opening 143ah to expose the first redistribution layer 142a. The first insulating film 144a may be subjected to a surface cleaning process using a cleaning agent containing Fe ions after being etched, or may be etched while being subjected to a surface cleaning process at the time of plasma treatment.

Then, second seed layers 142b-1 and 143b-1 may be formed on the second insulating layer 141b, the first redistribution layer 142a, and the second via hole 143bh. The second seed layers 142b-1 and 143b-1 may be formed by a plating process using sputtering, or the like. Each of the second seed layers 142b-1 and 143b-1 may be one layer or a plurality of layers including Ti, Cu, $TiO_2$, Ta, $TaO_2$, or the like, but is not limited thereto. Then, second plating layers 142b-2 and 143b-2 may be formed on the second seed layers 142b-1 and 143b-1 by any known plating method using a dry film 210, or the like, and portions of the second seed layer 142b-1 except for patterns may be removed by an etching process. Resultantly, the second redistribution layer 142b and the second via 143b may be formed. Then, the second insulating film 144b covering the second insulating layer 141b and the second redistribution layer 142b may be formed on the second insulating layer 141b and the second redistribution layer 142b using the silicon based compound such as the silicon based inorganic compound. The second insulating film 144b may be formed by a plasma deposition method. The plasma deposition method may be PECVD, ICP, sputtering, evaporation, or the like. The subsequent processes are processes of repeating the abovementioned processes, and a detailed description thereof is thus omitted.

Figure 12A:
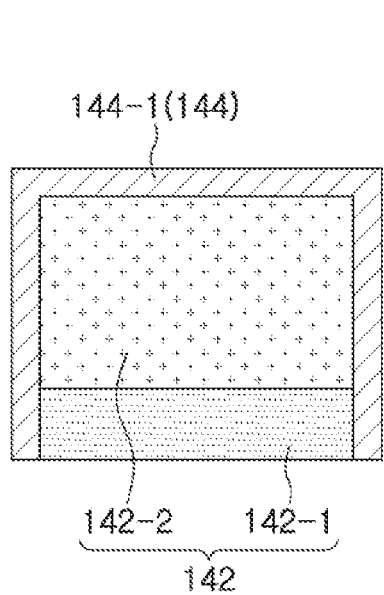
FIGS. 12A and 12B are schematic cross-sectional views illustrating various forms of an insulating film of the connection member of the fan-out semiconductor package of FIG. 9.
Figure 12B:
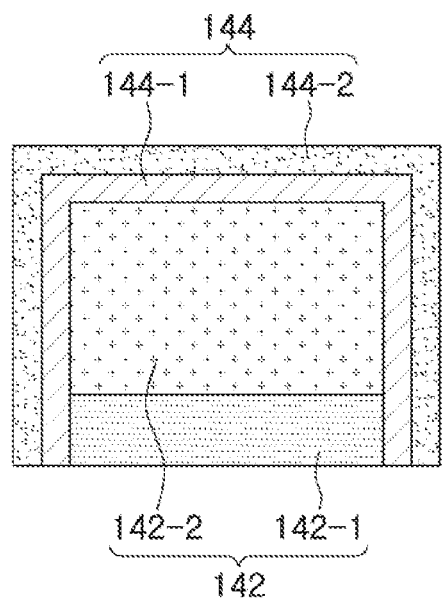

FIGS. 12A and 12B are schematic cross-sectional views illustrating various forms of an insulating film of the connection member of the fan-out semiconductor package of FIG. 9.

Referring to FIGS. 12A and 12B, as described above, each of the redistribution layers 142 may include a seed layer 142-1 and a plating layer 142-2. In this case, an insulating film 144 may include one layer 144-1 as illustrated in FIG. 12A or include a plurality of layers 144-1 and 144-2 as illustrated in FIG. 12B. Each of the layers 144-1 and 144-2 may include a silicon based compound such as a silicon based inorganic compound. For example, each of the layers 144-1 and 144-2 may include at least one of silicon oxide such as $SiO_2$, silicon nitride such as $SiN_x$, and silicon oxynitride such as $SiO_xN_y$, $SiO_xN_yH_z$, or the like, as described above. A thickness of each of the layers 144-1 and 144-2 may be about 5 nm to 100 nm, as described above, and a final thickness of the insulating film may have about 0.01 μm to 0.5 μm, more preferably, about 0.01 μm to 0.2 μm.

Figure 13:
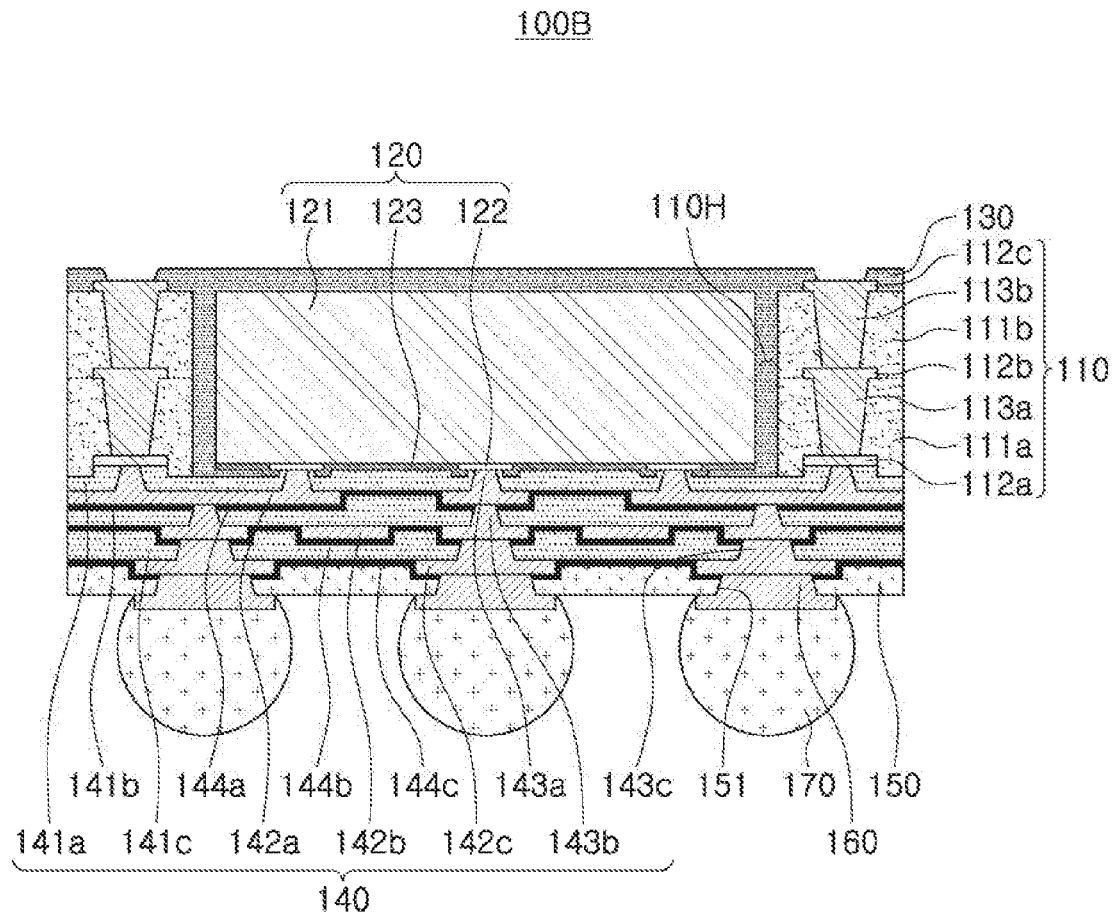
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, in a fan-out semiconductor package 100B according to another exemplary embodiment in the present disclosure, a core member 110 may include a first dielectric layer 111a in contact with a connection member 140, a first wiring layer 112a in contact with the connection member 140 and embedded in the first dielectric layer 111a, a second wiring layer 112b disposed on the other surface of the first dielectric layer 111a opposing one surface of the first dielectric layer 111a in which the first wiring layer 112a is embedded, a second dielectric layer 111b disposed on the first dielectric layer 111a and covering the second wiring layer 112b, and a third wiring layer 112c disposed on the second dielectric layer 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second dielectric layers 111a and 111b, respectively.

When the first wiring layer 112a is embedded in the first dielectric layer 111a, a step generated due to a thickness of the first wiring layer 112a may be significantly reduced, and an insulating distance of the connection member 140 may thus become constant. That is, a difference between a distance from a first redistribution layer 142a of the connection member 140 to a lower surface of the first dielectric layer 111a and a distance from the first redistribution layer 142a of the connection member 140 to the connection pad 122 of a semiconductor chip 120 may be smaller than a thickness of the first wiring layer 112a. Therefore, a high density wiring design of the connection member 140 may be easy.

A lower surface of the first wiring layer 112a of the core member 110 may be disposed on a level above a lower surface of the connection pad 122 of the semiconductor chip 120. In addition, a distance between the first redistribution layer 142a of the connection member 140 and the first wiring layer 112a of the core member 110 may be greater than that between the first redistribution layer 142a of the connection member 140 and the connection pad 122 of the semiconductor chip 120. The reason is that the first wiring layer 112a may be recessed into the first dielectric layer 111a. As described above, when the first wiring layer 112a is recessed into the first dielectric layer 111a, such that the lower surface of the first dielectric layer 111a and the lower surface of the first wiring layer 112a have a step therebetween, a phenomenon in which a material of an encapsulant 130 bleeds to pollute the first wiring layer 112a may be prevented. The second wiring layer 112b of the core member 110 may be disposed on a level between an active surface and an inactive surface of the semiconductor chip 120. The core member 110 may be formed at a thickness corresponding to that of the semiconductor chip 120. Therefore, the second wiring layer 112b formed in the core member 110 may be disposed on the level between the active surface and the inactive surface of the semiconductor chip 120.

Thicknesses of the wiring layers 112a, 112b, and 112c of the core member 110 may be greater than those of redistribution layers 142a, 142b, and 142c of the connection member 140. Since the core member 110 may have a thickness equal to or greater than that of the semiconductor chip 120, the wiring layers 112a, 112b, and 112c may be formed to have large sizes depending on a scale of the core member 110. On the other hand, the redistribution layers 142a, 142b, 142c of the connection member 140 may be formed to have sizes relatively smaller than those of the wiring layers 112a, 112b, and 112c for thinness.

A material of each of the dielectric layers 111a and 111b is not particularly limited. For example, an insulating material may be used as the material of each of the dielectric layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have any shape known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

Other configurations, for example, contents described with reference to FIGS. 9 through 12 may be applied to the semiconductor package 100B according to another exemplary embodiment, and a detailed description thereof overlaps that described above, and is thus omitted.

Figure 14:
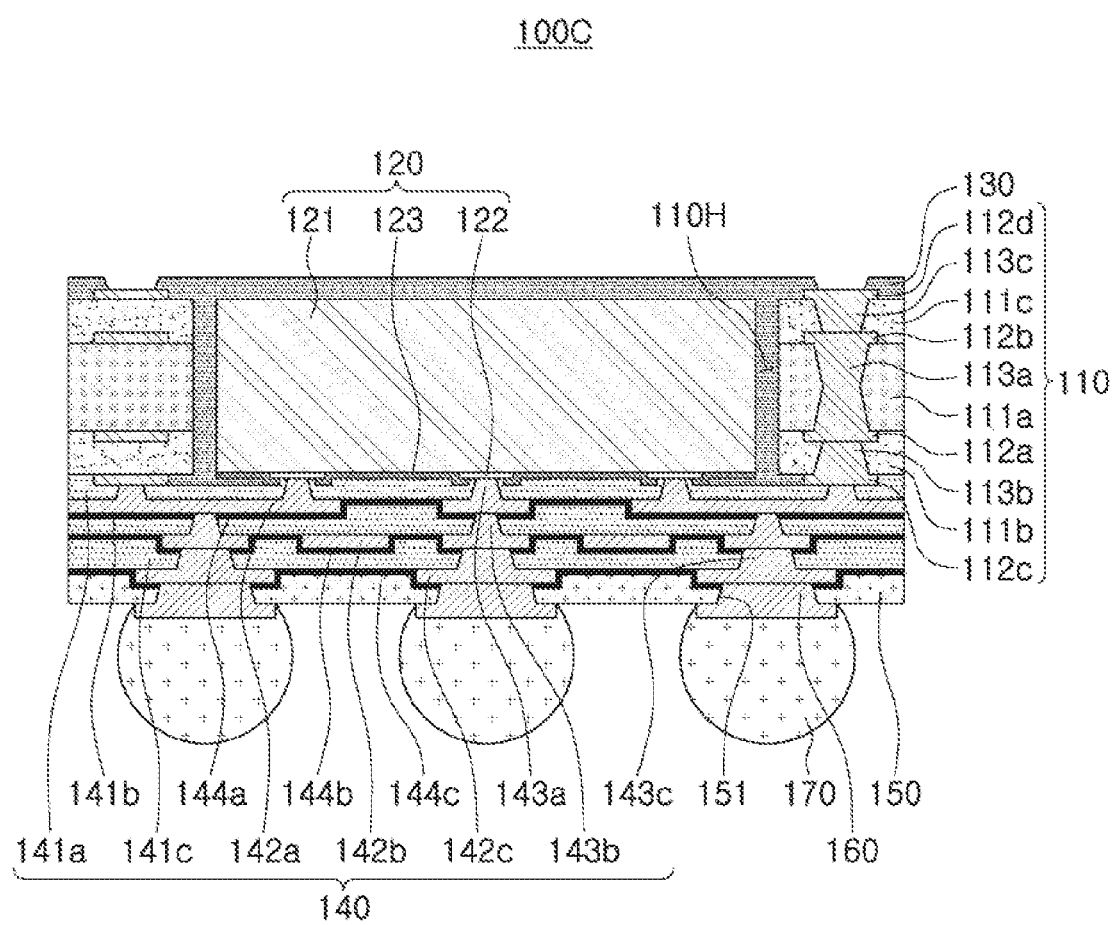
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, in a fan-out semiconductor package 100C according to another exemplary embodiment in the present disclosure, a core member 110 may include a first dielectric layer 111a, a first wiring layer 112a and a second wiring layer 112b disposed on opposite surfaces of the first dielectric layer 111a, respectively, a second dielectric layer 111b disposed on the first dielectric layer 111a and covering the first wiring layer 112a, a third wiring layer 112c disposed on the second dielectric layer 111b, a third dielectric layer 111c disposed on the first dielectric layer 111a and covering the second wiring layer 112b, and a fourth wiring layer 112d disposed on the third dielectric layer 111c. The first to fourth wiring layers 112a, 112b, 112c, and 112d may be electrically connected to connection pads 122. Since the core member 110 may include a large number of wiring layers 112a, 112b, 112c, and 112d, a connection member 140 may further be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c respectively penetrating through the first to third dielectric layers 111a, 111b, and 111c.

The first dielectric layer 111a may have a thickness greater than those of the second dielectric layer 111b and the third dielectric layer 111c. The first dielectric layer 111a may be basically relatively thick in order to maintain rigidity, and the second dielectric layer 111b and the third dielectric layer 111c may be introduced in order to form a larger number of wiring layers 112c and 112d. The first dielectric layer 111a may include an insulating material different from those of the second dielectric layer 111b and the third dielectric layer 111c. For example, the first dielectric layer 111a may be, for example, prepreg including a core material, a filler, and an insulating resin, and the second dielectric layer 111b and the third dielectric layer 111c may be an ABF or a PID film including a filler and an insulating resin. However, the materials of the first dielectric layer 111a and the second and third dielectric layers 111b and 111c are not limited thereto. Similarly, a first via 113a penetrating through the first dielectric layer 111a may have a diameter greater than those of a second via 113b and a third via 113c respectively penetrating through the second dielectric layer 111b and the third dielectric layer 111c.

A lower surface of the third wiring layer 112c of the core member 110 may be disposed on a level below a lower surface of the connection pad 122 of a semiconductor chip 120. In addition, a distance between a first redistribution layer 142a of the connection member 140 and the third wiring layer 112c of the core member 110 may be smaller than that between the first redistribution layer 142a of the connection member 140 and the connection pad 122 of the semiconductor chip 120. The reason is that the third wiring layer 112c may be disposed on the second dielectric layer 111b in a protruding form, resulting in being in contact with the connection member 140. The first wiring layer 112a and the second wiring layer 112b of the core member 110 may be disposed on a level between an active surface and an inactive surface of the semiconductor chip 120. Since the core member 110 may be formed at a thickness corresponding to that of the semiconductor chip 120, the first wiring layer 112a and the second wiring layer 112b formed in the core member 110 may be disposed on the level between the active surface and the inactive surface of the semiconductor chip 120.

Thicknesses of the wiring layers 112a, 112b, 112c, and 112d of the core member 110 may be greater than those of redistribution layers 142a, 142b, and 142c of the connection member 140. Since the core member 110 may have a thickness equal to or greater than that of the semiconductor chip 120, the wiring layers 112a, 112b, 112c, and 112d may also be formed to have large sizes. On the other hand, the redistribution layers 142a, 142b, and 142c of the connection member 140 may be formed to have relatively small sizes for thinness.

Other configurations, for example, contents described with reference to FIGS. 9 through 12 may be applied to the semiconductor package 100C according to another exemplary embodiment, and a detailed description thereof overlaps that described above, and is thus omitted.

As set forth above, according to the exemplary embodiments in the present disclosure, a fan-out semiconductor package in which close adhesion between an insulating material and a metal circuit may be improved, heat resistance characteristics may be high, and diffusion of a metal may be suppressed, in a connection member for redistributing connection pads of a semiconductor chip may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a semiconductor chip having an active surface having connection pads disposed thereon and an inactive surface opposing the active surface, the semiconductor chip including a passivation layer exposing the connection pads and disposed on a body of the semiconductor chip;
   an encapsulant encapsulating at least portions of the semiconductor chip; and
   a connection member including a first insulating layer disposed on the active surface of the semiconductor chip, a first redistribution layer disposed on the first insulating layer, first vias penetrating through the first insulating layer and connecting the connection pads and the first redistribution layer to each other, and a first insulating film covering the first insulating layer and the first redistribution layer,
   wherein the first insulating film includes a silicon based compound,
   the first redistribution layer has a first surface facing the first insulating layer, and a second surface opposing the first surface and covered by the first insulating film,
   the first insulating film covers side surfaces of the first redistribution layer connecting the first and second surfaces to each other,
   the connection member comprises a first region on which the semiconductor chip is disposed, and a second region surrounding the first region and not overlapping the semiconductor chip in a stacking direction of the first region and the semiconductor chip,
   the connection pads and the passivation layer are disposed between the first region and the body, and
   the first redistribution layer and the first insulating film extend from the first region to the second region.

2. The semiconductor package of claim 1, wherein the silicon based compound includes a silicon based inorganic compound.

3. The semiconductor package of claim 2, wherein the silicon based inorganic compound includes silicon oxide, silicon nitride, or silicon oxynitride.

4. The semiconductor package of claim 2, wherein the silicon based inorganic compound includes at least one selected from the group consisting of $SiO_2$, $SiO_xN_y$, $SiN_x$, and $SiO_xN_yH_z$.

5. The semiconductor package of claim 1, wherein the first insulating film has a thickness of 0.01 μm to 0.2 μm.

6. The semiconductor package of claim 1, wherein the first insulating film includes a multilayer structure.

7. The semiconductor package of claim 1, wherein the first insulating layer includes a photoimagable dielectric (PID).

8. The semiconductor package of claim 1, wherein the first redistribution layer includes copper (Cu).

9. The semiconductor package of claim 1, wherein the connection member further includes a second insulating layer disposed on the first insulating film, a second redistribution layer disposed on the second insulating layer, second vias penetrating through the second insulating layer and connecting the first redistribution layer and the second redistribution layer to each other, and a second insulating film covering the second insulating layer and the second redistribution layer, and
   the first insulating film is disposed on an interface between the first insulating layer and the second insulating layer and an interface between the first redistribution layer and the second insulating layer.

10. The semiconductor package of claim 9, wherein the first insulating film has openings which the second vias respectively penetrate through.

11. The semiconductor package of claim 9, wherein the connection member further includes a third insulating layer disposed on the second insulating film, a third redistribution layer disposed on the third insulating layer, third vias penetrating through the third insulating layer and connecting the second redistribution layer and the third redistribution layer to each other, and a third insulating film covering the third insulating layer and the third redistribution layer,
   the second insulating film is disposed on an interface between the second insulating layer and the third insulating layer and an interface between the second redistribution layer and the third insulating layer, and the semiconductor package further includes another passivation layer disposed on the third insulating film and having openings exposing portions of the third redistribution layer.

12. The semiconductor package of claim 11, wherein at least one or more of the openings of the another passivation layer are disposed in a fan-out region.

13. The semiconductor package of claim 9, wherein a thickness of the first insulating film is less than those of the first insulating layer and the second insulating layer.

14. The semiconductor package of claim 1, further comprising a core member having a through-hole,
    wherein the semiconductor chip is disposed in the through-hole of the core member.

15. The semiconductor package of claim 14, wherein the core member includes a first dielectric layer, a first wiring layer in contact with the connection member and embedded in the first dielectric layer, and a second wiring layer disposed on the other surface of the first dielectric layer opposing one surface of the first dielectric layer in which the first wiring layer is embedded, and
    the first and second wiring layers are connected to the connection pads.

16. The semiconductor package of claim 15, wherein the core member further includes a second dielectric layer disposed on the first dielectric layer and covering the second wiring layer and a third wiring layer disposed on the second dielectric layer, and
    the third wiring layer is connected to the connection pads.

17. The semiconductor package of claim 14, wherein the core member includes a first dielectric layer, and a first wiring layer and a second wiring layer disposed on opposite surfaces of the first dielectric layer, respectively, and
    the first and second wiring layers are connected to the connection pads.

18. The semiconductor package of claim 17, wherein the core member further includes a second dielectric layer disposed on the first dielectric layer and covering the first wiring layer and a third wiring layer disposed on the second dielectric layer, and
    the third wiring layer is connected to the connection pads.

19. The semiconductor package of claim 18, wherein the core member further includes a third dielectric layer disposed on the first dielectric layer and covering the second wiring layer and a fourth wiring layer disposed on the third dielectric layer, and
    the fourth wiring layer is connected to the connection pads.

20. The semiconductor package of claim 1, wherein the first insulating film consists of an insulating inorganic compound.

21. A semiconductor package comprising:
    a semiconductor chip having an active surface having connection pads disposed thereon and an inactive surface opposing the active surface;
    an encapsulant encapsulating at least portions of the semiconductor chip; and
    a connection member including an insulating layer disposed on the active surface of the semiconductor chip, a redistribution layer disposed on the insulating layer, vias penetrating through the insulating layer and connecting the connection pads and the redistribution layer to each other, and an insulating film covering the insulating layer and the redistribution layer,
    wherein the insulating film includes a silicon based compound,
    the connection member is disposed on the active surface of the semiconductor chip and the encapsulant,
    the connection member comprises a first region on which the semiconductor chip is disposed, and a second region surrounding the first region and not overlapping the semiconductor chip in a stacking direction of the first region and the semiconductor chip,
    the redistribution layer and the insulating film extend from the first region to the second region.

22. The semiconductor package of claim 21, wherein the encapsulant covers side surfaces of the semiconductor chip and extends onto a portion of the active surface between the semiconductor chip and the insulating layer.

23. The semiconductor package of claim 21, wherein the insulating layer includes a photoimagable dielectric (PID).

24. A semiconductor package comprising:
    a semiconductor chip having an active surface having connection pads disposed thereon and an inactive surface opposing the active surface;
    an encapsulant encapsulating at least portions of the semiconductor chip; and
    a connection member disposed on the semiconductor chip, the connection member including:
    insulating layers,
    redistribution layers disposed on the insulating layers, respectively,
    via layers respectively disposed in the insulating layers, and connecting the connection pads and the redistribution layers to each other,
    an insulating film including a silicon based compound, and disposed directly on an outermost insulating layer of the insulating layers and an outermost redistribution layer of the redistribution layers, and
    a passivation layer disposed directly on the insulating film and having openings exposing portions of the outermost redistribution layer.

* * * * *